United States Patent [19]

Lawson

[11] Patent Number: 4,514,634

[45] Date of Patent: Apr. 30, 1985

[54] ELECTRON BEAM FOCUSSING

[75] Inventor: Peter J. Lawson, Cambridge, England

[73] Assignee: Cambridge Instruments Limited, Cambridge, England

[21] Appl. No.: 470,950

[22] Filed: Mar. 1, 1983

[30] Foreign Application Priority Data

Mar. 2, 1982 [GB] United Kingdom ............... 8206018

[51] Int. Cl.³ ..................... G21K 1/08; H01J 3/14; H01J 29/58
[52] U.S. Cl. ................... 250/397; 250/396 R; 250/310; 250/311; 315/382
[58] Field of Search ........... 324/71.3; 250/397, 396, 250/310, 311; 315/382

[56] References Cited

U.S. PATENT DOCUMENTS 3,937,959 2/1976 Namae ................ 250/311

FOREIGN PATENT DOCUMENTS 52-64865 5/1977 Japan ..................... 250/397
54-57948 5/1979 Japan ..................... 250/397

Primary Examiner—Alfred E. Smith
Assistant Examiner—Jack I. Berman
Attorney, Agent, or Firm—Leydig, Voit, Osann, Mayer & Holt, Ltd.

[57] ABSTRACT

An automatic focussing arrangement for use with scanning electron beam apparatus such as a scanning electron microscope or electron beam microfabrication apparatus sets the focus coil (18) current at each one of a plurality of predetermined values in turn. At each setting, the scanning system (10, 12, 14) is activated to frame-scan the electron beam across a predetermined sharp-edged target. The resultant video signal (22) is monitored for each line of the frame scan to derive the mean value, then the mean value is subtracted from the instantaneous value of the video signal for that line (this may be carried out during a second scan of the same line), and the difference is then squared and integrated. The integrated outputs corresponding to each line scan are monitored to determine the greatest one. This is then stored (32) in association with the corresponding level of the focus drive current, and the process is then repeated. When frame scans have been carried out corresponding to all values of the focus current, the maximum one of all the stored integrated outputs is determined by a computer (38) and this identifies the optimum focus drive current. The focus drive current may then automatically be set to this value via a presettable counter (36).

18 Claims, 4 Drawing Figures

ELECTRON BEAM FOCUSSING

BACKGROUND OF THE INVENTION

The invention relates to focussing arrangements for focussing electron beams, such as are used in scanning electron microscopes or electron beam microfabrication apparatus for example.

SUMMARY OF THE INVENTION

According to the invention, there is provided a focussing method for measuring the focus of an electron beam, comprising the steps of scanning the beam across a predetermined and sharp-edged target for a plurality of times each at a different level of focus, producing an output signal during each such scan in dependence on the effect on the electrons in the beam of the said target, integrating the square of each such signal, and comparing the values of the integrated outputs to determine the value thereof corresponding to optimum focus.

According to the invention, there is also provided a focussing arrangement for measuring the focus of an electron beam, comprising scanning means for scanning the electron beam across a predetermined and sharp-edged target for a plurality of times, focus adjusting means for adjusting the focus of the beam to a different level during each such scan, video signal generating means responsive to the electrons in the beam as they are affected by the target during each such scan to produce a respective output signal during that scan, circuit means for squaring and integrating each such output signal to produce a respective integrated output, and comparing means for comparing the values of the integrated outputs to determine the value corresponding to optimum focus.

According to the invention, there is further provided a focussing arrangement for measuring and adjusting the focus of an electron beam and incorporated in apparatus having an electron beam source, scanning means for scanning the electron beam across a target area, focussing means for adjusting the focus of the electron beam, and signal generating means responsive to the electrons received in the target area to produce a corresponding electrical video signal, and comprising means operative to increment the focus level of the beam through a predetermined series of values thereof, a predetermined sharp-edged target in the said target area, control means operative to cause the scanning means to frame-scan the electron beam over the said target so as to perform a respective frame scan for each setting of the focus level of the beam, circuit means operative during each frame scan to derive, for each line scan thereof, an integrated signal corresponding to the integral of the square of the video signal produced by that line scan, circuit means operative to determine the maximum integrated signal for each frame scan, storage means operative to store each said maximum integrated signal and the corresponding value of the focus level, and comparing means operative to compare the stored maximum integrated signals whereby to determine the greatest one thereof and thereby the optimum value of the focus level.

DESCRIPTION OF THE DRAWINGS

Arrangements embodying the invention and for measuring and adjusting the focus of an electron beam will now be described, by way of example only, with reference to the accompanying diagrammatic drawing in which.

DESCRIPTION OF PREFERRED EMBODIMENTS

The focussing arrangement now to be described may be incorporated into a scanning electron microscope or electron beam microfabrication apparatus, in each of which, in use, an electron beam is directed at a target for inspecting or processing it. Clearly, for optimum operation, the electron beam needs to be correctly focussed, that is, the electron beam needs to be of minimum cross-sectional size at the working area.

The focussing arrangement carries out automatic adjustment of the focus current of the apparatus, that is, the current through the focus coil which determines the focussing of the beam, and monitors the crosssectional area of the beam at the working area, that is, the position where the target is located in use, so as to determine the focus current giving the best focus. The focussing arrangement may then automatically set the focus current to the optimum value.

Figure 1:
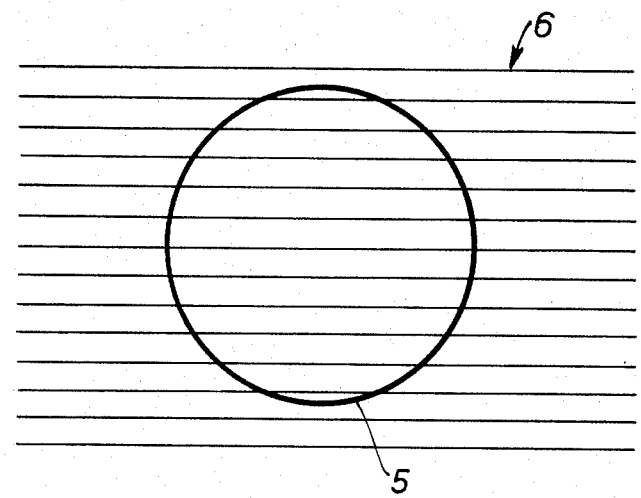
FIG. 1 is a diagrammatic view of a target which is scanned by the electron beam during the focus measurement.

The focussing arrangement carries out this process by scanning the electron beam across a target of predetermined cross-sectional area and having sharply defined edges. FIG. 1 shows the target 5 which in this example is circular in cross-section. During the focussing process, as will be described in more detail below, the electron beam is scanned a number of times across the target as shown diagrammatically by the lines 6 in FIG. 1.

Figure 2:
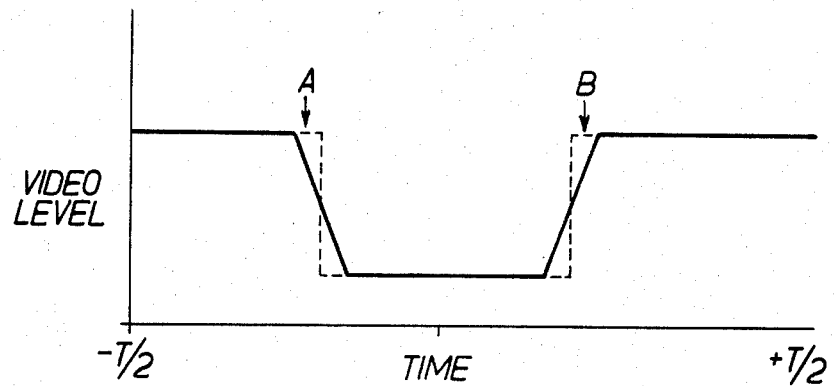
FIG. 2 is a waveform of a video signal produced during the scanning process.

FIG. 2 shows the video signal produced by one such scan, that is, the signal produced by the electron beam as affected by the target. As shown in FIG. 2, the level of the video signal drops abruptly (as shown in the region A) when the scanned beam is interrupted by the edge of the target and falls to a low level which is held until the beam reaches the opposite edge of the target and rises rapidly again, as shown in the region B in FIG. 2. The dotted lines in the regions A and B of FIG. 2 show the shape of the signal which is produced in conditions of optimum focus, that is, when the cross-sectional area of the electron beam is at a minimum where it strikes the target. The full line in each of the regions A and B show the video signal produced in conditions of poor focus; here, the beam cross-section is not at a minimum and therefore the beam is not abruptly cut off when it reaches the edge of the target during the scanning process but undergoes a comparatively gradual reduction until the whole of the beam area is obscured by the target. A corresponding process clearly occurs when the beam reaches the opposite edge of the target. In a manner to be explained, the focus arrangement sets the focus current at a particular level, close to one end of its range, and carries out a raster scan of the target (as shown in FIG. 1), monitoring and processing the video signals produced by each line scan of the raster. The focus current is then incremented to a new value and the sequence repeated, and so on until the focus current has been incremented to the opposite end of its range. The signals are then processed to derive the optimum focus current.

More specifically, it will be apparent that the video signal, V(x, y), derived from the target is a function of the target contrast g (x, y), the radius R of the beam spot at the target, and the subsequent signal processing, where x and y are the co-ordinates of the target surface. If the beam spot has an intensity distribution h $(x_o, y_o)$ (that is, the intensity of the beam spot at a point $x_o$, $y_o$ from its origin is h $(x_o, y_o)$), the signal produced when the beam spot is positioned at x, y, is the sum of the signals from all points which the beam spot illuminates and is given by $$V(x, y) = \int\int g(x_1, y_1) \cdot h(x-x_1, y-y_1) \cdot dx_1 \cdot dy_1 \quad (1)$$

The two functions g(x, y) and h(x, y) can be represented by their 2-dimensional Fourier equivalents $G(\omega_x, \omega_y)$ and $H(\omega_x, \omega_y)$. Therefore Equation (1) can be re-written as $$V(\omega_x, \omega_y) = G(\omega_x, \omega_y) \cdot H(\omega_x, \omega_y) \quad (2)$$

This shows that the specimen contrast G is 'filtered' or 'modulated' by H. For perfect fidelity of imaging, $\omega_x$, $\omega_y) = 1$.

The intensity distribution can conveniently be represented as $$h(x_o, y_o) = \frac{e^{-(x_o^2+y_o^2)/2R^2}}{2R^2/R} \quad (3)$$

Equation (3) can be rewritten in the form of its Fourier equivalent $$H(\omega_x, \omega_y) = e^{-(\omega x^2 + \omega y^2) \cdot R^2/2} \quad (4)$$

Equation (4) shows that as R becomes smaller (that is, as the focus is improved), H increases for all nonzero values of $\omega$. Substituting Equation (4) in Equation (2), $$V(\omega_x, \omega_y) = G(\omega_x, \omega_y) \cdot e^{-(\omega x^2 + \omega y^2) \cdot R^2/2} \quad (5)$$

Therefore, $V(\omega_x \cdot \omega_y)$ increases at all non-zero frequencies as the focus improves. Thus, by monitoring the video signal and measuring its total non-zero frequency content, a measure of the degree of focus is obtained.

In fact the specimen contrast $G(\omega_x, \omega_y)$ has a large value at zero frequency. This in turn means that $V(\omega_x, \omega_y)$ has a large value V(0, 0) at zero frequency. Since G(0, 0) does not depend on focus, neither does V(0, 0) and unless V(0, 0) is removed, the use of $V(\omega_x, \omega_y)$ at non-zero frequencies as a measure of focus will be an insensitive measure.

Therefore, as will become apparent, the system to be described first measures the average value of the video signal for each line scan. This is equivalent to determining the zero frequency value of $V(\omega_x, \omega_y)$ in Equation (5). This average value is then subtracted from the video signal and the result is squared and integrated, thus measuring the total non-zero frequency content of $V(\omega_x, \omega_y)$. This is therefore a measure of the degree of focus b.ut without the insensitivity caused by the swamping effect of the contrast value at zero frequency.

In a manner to be explained, the various values of $V(\omega_x, \omega_y)$ obtained in this way are compared to find the focus current giving the greatest value of $V(\omega_x, \omega_y)$.

Figure 3:
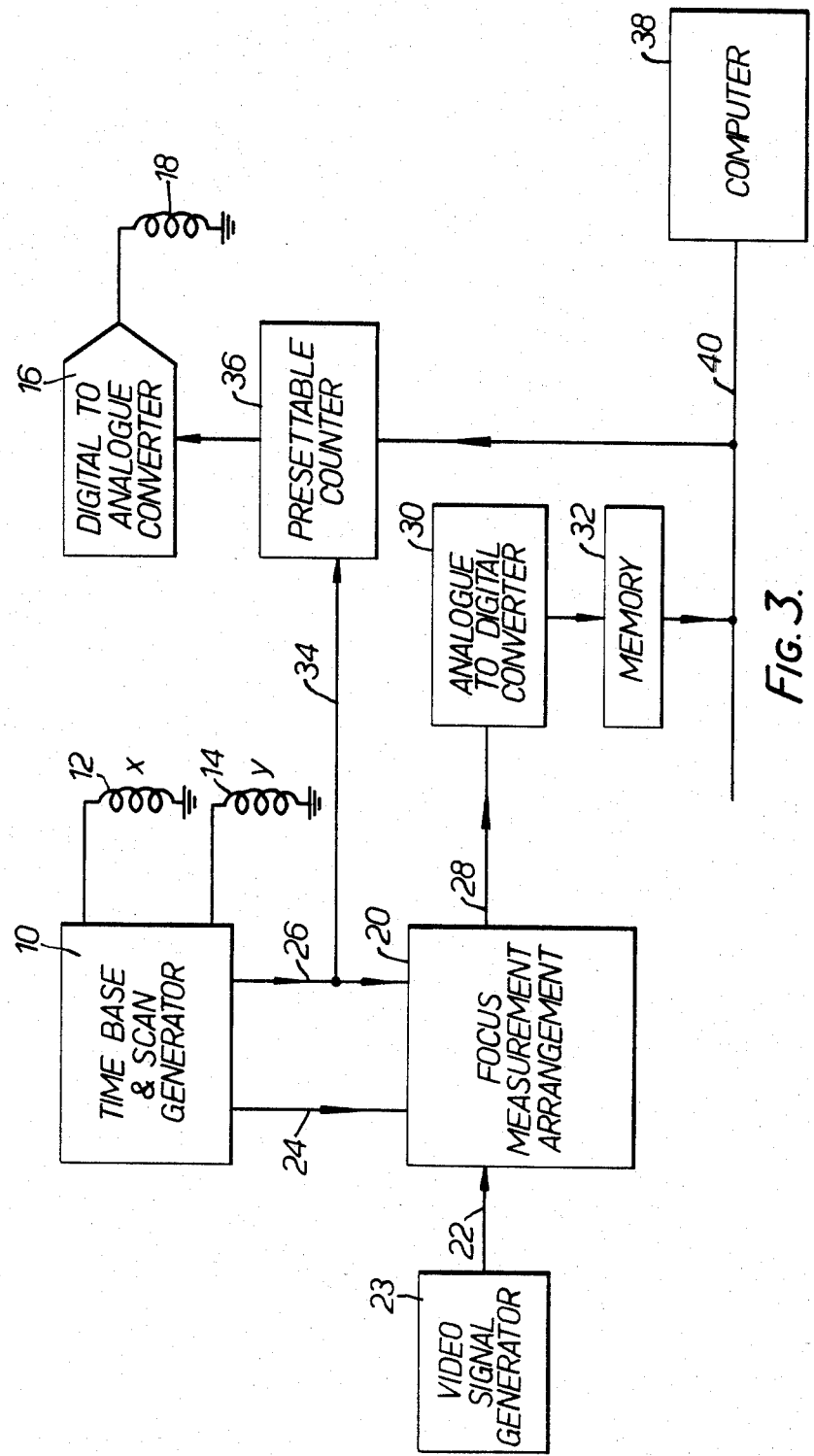
FIG. 3 is a block diagram of the focussing arrangement.

As shown in FIG. 3, the apparatus has a time base and scan generator 10, which may be of conventional form, and energises the normal "X" and "Y" deflection coils 12 and 14 to cause the electron beam to scan across the target. During this process, a digital-to-analogue converter 16 sets the focus current through the focus coil 18 to a predetermined level close to one end of its range.

The focus measuring arrangement 20, to be described in more detail, receives the video signal on a line 22 as produced by the electron beam (via a video signal generator 23) during the raster scan, and is controlled by line sync and frame sync signals received from the scan generator 10 on lines 24 and 26. The generator 23 may have any convenient form (e.g.a video camera), in dependence on the type of apparatus in which the electron beam is being used, so as to generate the video signal shown in FIG. 1. For each raster scan, the focus measuring arrangement 20 produces a focus measure signal on a line 28, dependent on the degree of focus, and this is converted into digital form by an analogue-to-digital converter 30 and stored in a memory 32.

Each frame sync signal is passed on a line 34 to increment a pre-settable counter 36 which energises the digital-to-analogue converter 16 to increment the focus current through the focus coil 18 to the next value, ready for the next raster scan. In fact, as will be explained in more detail below with reference to FIG. 4, each line is scanned twice in each raster.

A computer 38 receives the stored focus-representing digital signal in the memory 32 via a computer bus 40 when a complete series of raster scans has been carried out (that is, when the focus current has been incremented throughout its range). It processes these signals to determine which value of focus current gives the optimum focus. It then pre-sets the counter 36 accordingly so as to set the focus current at this value.

Figure 4:
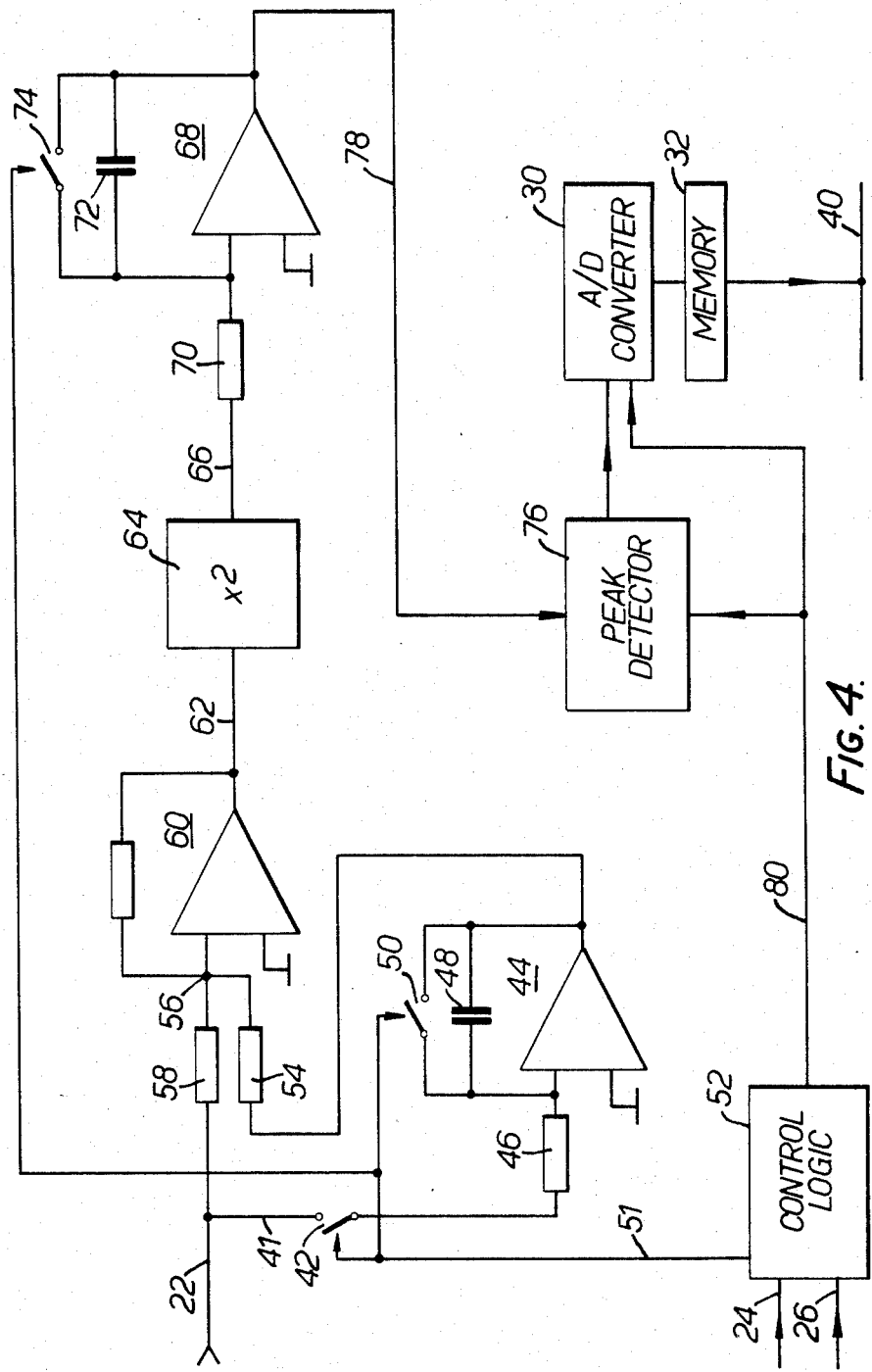
FIG. 4 is a more detailed diagram of part of the block diagram of FIG. 3.

The focus measuring arrangement 20 of FIG. 3, and the manner of its operation, will now be explained in more detail with reference to FIG. 4.

With the focus current set to a particular value by the digital-to-analogue converter 16 (FIG. 3), the scan generator 10 causes the electron beam to perform the first line scan across the target 5 (FIG. 1) and the resultant video signal arrives on line 22 (FIG. 4) and is applied by a line 41 and a switch 42 to an integrator 44 having a resistor 46, an integrating capacitor 48 and a re-setting switch 50.

Switches 42 and 50 are controlled via a line 51 by control logic 52 which receives the line and frame. sync signals on lines 24 and 26 (see FIG. 3) from the scan generator 10.

During the first line scan, switch 50 is held open by the control logic 52 and switch 42 closed, and the integrator 44 therefore integrates the video signal. If the incoming video signal is represented by f(t), the output of integrator 44 at the end of the first line scan will be the mean value of f(t) for the line, that is, $\bar{f})/$ .

At the end of the first line scan, the control logic 52 receives a line scan signal on line 24 and opens switch 42. Switch 50 is maintained open and therefore the integrated output of the integrator 44 is held. As previously explained, the scan generator 10 (FIG. 3) causes the line to be re-scanned (with the focus current unchanged).

During the second scan of the first line, the output $\bar{f})/$ from integrator 44 is passed through a resistor 54 to a point 56 where it is subtracted from the incoming video signal f(t) on line 22 which is applied to point 56 via a resistor 58. An amplifier 60 amplifies the difference signal so as to produce an output signal on a line 62 given by $$S_1 = [f(t) - \bar{f}(t)]$$

The signal $S_1$ is squared by a squaring circuit 64 so as to produce a signal $$S_2 = [(f(t) - \bar{f}(t)]^2$$

on a line 66 which is applied to a second integrator 68 having a resistor 70, an integrating capacitor 72 and a re-setting switch 74.

Switch 74 is controlled by the control logic 52 and is open during this second scan of the first line and therefore integrates the signal $S_2$ to produce a signal $$S_3 = \int_{-T/2}^{T/2} [f(t) - \bar{f}(t)]^2 \cdot dt$$

and this is passed to a peak detector 76 on a line 78.

At the end of the second scan of the first line, the line sync signal on line 24 causes the control logic 52 to close the switches 50 and 74. Switch 74 is maintained closed but switch 50 is immediately re-opened. Switch 42 is then closed and the first scan of the second line now commences (the focus current still being unchanged). Integrator 44 therefore now produces the mean value $\bar{f}/$ of the video signal for the second line. At the end of the first scan of the second line, the control logic 52 opens switches 42 and 74 (switch 50 being maintained opened).

The second line is now re-scanned (the focus current being unchanged).

Therefore, signal $S_1$ is now produced on line 62 for the second line, squared by the squarer 64 to produce the signal $S_2$ and integrated by integrator 68 to produce the signal $S_3$.

At the end of the second scan of the second line, the control logic 52 once more closes switches 50 and 74, re-opens switch 50 and closes switch 42, and the sequence described above repeats (the focus current again being unchanged).

The peak detector 76 measures the peak value of the signal $S_3$ at the end of the second scan of each line, and at the end of the frame is therefore holding the peak value of the signal $S_3$ for the whole frame. When the control logic 52 receives the frame sync signal on line 26, it sends a control signal to the peak detector 76 via a line 80 which causes the peak detector 76 to output its stored peak value to the analogue-to-digital converter 30 (see also FIG. 3) on line 28. The peak detector 76 is then re-set and the signal on line 80 causes the analogue-to-digital converter 30 to convert the peak value into digital form and to pass it to the memory 32.

As already explained in connection with FIG. 3, the digital-to-analogue converter 16 then increments the focus current and the process described above with reference to FIG. 4 is repeated for the second frame scan.

During the first line scan of each line, switch 74 is held closed by the control logic 52 as already explained, and this therefore prevents the integrator 68 from producing an output.

When a sufficient number of frame scans has been carried out to have incremented the focus current throughout its range, the memory 32 will be storing a series of values of the signal $S_3$, each value being the maximum value of that signal for a series of line scan carried out at a particular setting of the focus current.

The computer 38 then reads the stored values of the signal $S_3$ and processes them to locate the value of focus current giving the maximum value of $S_3$. For example, the computer may carry out a least squares curve fitting analysis on the stored values of signal $S_3$ versus focus current.

The computer then sets the focus current to this optimum value via the counter 36 and digital-to-analogue converter 16 (FIG. 3).

Various modifications are possible in order to implement the process described. It may not be essential to carry out a frame scan at each value of focus current: a single line scan at each value of focus current may suffice. However, carrying out a frame scan at each value of focus current and detecting the peak value of the signal $S_3$ during that frame scan overcomes errors which may be produced as a result of imperfections in the alignment of the electron beam column which can cause a shift in the scan position when the focus coil drive current is changed. Such a shift can cause a change in effective cross-section and this causes a change in value of the signal which is not related to an actual change in focus.

What is claimed is:

1. A focussing method for measuring the focus of an electron beam, comprising the steps of
    scanning the beam across a predetermined and sharp-edged target for a plurality of times each at a different level of focus,
    producing an output signal during each such scan in dependence on the effect on the electrons in the beam of the said target,
    integrating the square of each such signal, and
    comparing the values of the integrated outputs to determine the value thereof corresponding to optimum focus.

2. A method according to claim 1, in which each such scan is a respective line scan.

3. A method according to claim 1, in which each such scan is a frame scan made up of a plurality of line scans during each line of which the level of focus is nominally the same.

4. A method according to claim 3 comprising the steps of
    integrating the square of each output signal produced during each line scan of a respective frame scan, and
    determining the maximum integrated output determined for that frame scan,
    and in which the comparing step comprises the step of comparing the maximum integrated outputs of all the frame scans to determine the value corresponding to optimum focus.

5. A method according to claim 1, in which the said output signal produced during each said scan is the instantaneous signal produced by the electrons during the continuance of that scan.

6. A method according to claim 1, including the steps of
    producing an intermediate signal for each scan which is instantaneously dependent on the effect on the electrons of the target during that scan, and
    producing the said output signal for that scan in dependence on the instantaneous difference between the intermediate signal for that scan and the mean value of that intermediate signal for the whole of that scan.

7. A method according to claim 6, including the steps of
forming each said scan by passing the beam across the same part of the target twice at the same level of focus whereby to produce the said intermediate signal twice,
responding to the intermediate signal produced during one of those two passes so as to produce the mean value of the signal, and
subtracting that mean value from the intermediate signal produced during the other one of the said two passes whereby to produce the said output signal for that scan.

8. A method according to claim 1, including the step of setting the focus to the optimum determined value thereof.

9. A focussing arrangement for measuring the focus of an electron beam, comprising
scanning means for scanning the electron beam across a predetermined and sharp-edged target for a plurality of times,
focus adjusting means for adjusting the focus of the beam to a different level during each such scan,
video signal generating means responsive to the electrons in the beam as they are affected by the target during each such scan to produce a respective output signal during that scan,
circuit means for squaring and integrating each such output signal to produce a respective integrated output, and
comparing means for comparing the values of the integrated outputs to determine the value corresponding to optimum focus 10. An arrangement according to claim 9, in which each such scan is a respective line scan.

11. An arrangement according to claim 9, in which each such scan is a frame scan made up of a plurality of line scans during each line of which the level of focus is nominally the same.

12. An arrangement according to claim 9, in which
the scanning means scans the electron beam across the target in a plurality of line scans making up successive frame scans, and
the focussing means maintains the level of focus nominally the same for all the line scans of each respective frame scan; and
including circuit means for determining the maximum said integrated output for each frame scan,
the comparing means comparing the maximum integrated outputs for all the frame scans to determine the value corresponding to optimum focus.

13. An arrangement according to claim 9, in which the signal generating means produces each said output signal as the instantaneous signal produced by the electrons during the respective said scan.

14. An arrangement according to claim 9, in which the signal generating means comprises circuit means for producing an intermediate signal for each scan which is instantaneously dependent on the effect on the electron beam during that scan of the target, and
circuit means for producing the said output signal for that scan in dependence on the instantaneous difference between the intermediate signal and the mean value of the intermediate signal for the duration of that scan.

15. An arrangement according to claim 14, in which
the scanning means performs each said scan by passing the beam across the same part of the target twice at the same level of focus, and
the signal generating means comprises circuit means responsive to the said intermediate signal produced during one of the two passes to produce the mean value thereof, and subtracting means for subtracting the said mean value from the intermediate signal produced by the electrons during the other one of the two said passes whereby to produce the said output signal for that scan.

16. An arrangement according to claim 9, including focus adjusting means for setting the focus of the electron beam to the optimum determined value thereof.

17. A focussing arrangement for measuring and adjusting the focus of an electron beam and incorporated in apparatus having an electron beam source, scanning means for scanning the electron beam across a target area, focussing means for adjusting the focus of the electron beam, and signal generating means responsive to the electrons received in the target area to produce a corresponding electrical video signal, and comprising
means operative to increment the focus level of the beam through a predetermined series of values thereof,
a predetermined sharp-edged target in the said target area,
control means operative to cause the scanning means to frame-scan the electron beam over the said target so as to perform a respective frame scan for each setting of the focus level of the beam,
circuit means operative during each frame scan to derive, for each line scan thereof, an integrated signal corresponding to the integral of the square of the video signal produced by that line scan,
circuit means operative to determine the maximum integrated signal for each frame scan,
storage means operative to store each said maximum integrated signal and the corresponding value of the focus level, and
comparing means operative to compare the stored maximum integrated signals whereby to determine the greatest one thereof and thereby the optimum value of the focus level.

18. An arrangement according to claim 17, including means operative in response to the determination of the optimum value of the focus level to set the focus level at that value.

* * * * *